(12) United States Patent
Kim et al.

(10) Patent No.: US 10,008,625 B2
(45) Date of Patent: *Jun. 26, 2018

(54) ATOMIC LAYER DEPOSITION FOR PHOTOVOLTAIC DEVICES

(71) Applicant: INTERNATIONAL BUSINESS MACHINES CORPORATION, Armonk, NY (US)

(72) Inventors: Jeehwan Kim, White Plains, NY (US); David B. Mitzi, Mahopac, NY (US); Byungha Shin, White Plains, NY (US); Teodor K. Todorov, Yorktown Heights, NY (US); Mark T. Winkler, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 289 days.

This patent is subject to a terminal disclaimer.

(21) Appl. No.: 14/819,007

(22) Filed: Aug. 5, 2015

(65) Prior Publication Data

US 2015/0340536 A1 Nov. 26, 2015

Related U.S. Application Data

(63) Continuation of application No. 13/685,126, filed on Nov. 26, 2012, now Pat. No. 9,153,729.

(51) Int. Cl.
*H01L 31/02* (2006.01)
*H01L 31/0264* (2006.01)
(Continued)

(52) U.S. Cl.
CPC .... *H01L 31/0749* (2013.01); *H01L 31/02167* (2013.01); *H01L 31/0326* (2013.01);
(Continued)

(58) Field of Classification Search
CPC .......... H01L 31/0216; H01L 31/02167; H01L 31/0256
See application file for complete search history.

(56) References Cited

U.S. PATENT DOCUMENTS 4,544,797 A 10/1985 Hewig
5,482,570 A 1/1996 Saurer et al.
(Continued)

FOREIGN PATENT DOCUMENTS

JP 2641800 B2 8/1997
JP 2009164544 A 7/2009

OTHER PUBLICATIONS

U.S. Office Action dated Mar. 25, 2015 in U.S. Appl. No. 13/969,046.
(Continued)

*Primary Examiner* — Susan D Leong
(74) *Attorney, Agent, or Firm* — Tutunjian & Bitetto, P.C.; Louis J. Percello

(57) ABSTRACT

A photovoltaic device and method include a substrate, a conductive layer formed on the substrate and an absorber layer formed on the conductive layer from a Cu—Zn—Sn containing chalcogenide material. An emitter layer is formed on the absorber layer and a buffer layer is formed on the emitter layer including an atomic layer deposition (ALD) layer. A transparent conductor layer is formed on the buffer layer.

9 Claims, 2 Drawing Sheets

(51) Int. Cl.
  *H01L 31/0749* (2012.01)
  *H01L 31/18* (2006.01)
  *H01L 31/0216* (2014.01)
  *H01L 31/032* (2006.01)
  *H01L 31/072* (2012.01)

(52) U.S. Cl.
  CPC ............ *H01L 31/072* (2013.01); *H01L 31/18* (2013.01); *H01L 31/1868* (2013.01); *Y02E 10/50* (2013.01)

(56) References Cited

U.S. PATENT DOCUMENTS

| | | | |
|---|---|---|---|
| 7,652,209 | B2 | 1/2010 | Delahoy |
| 8,212,143 | B2 | 7/2012 | Tsai et al. |
| 9,153,729 | B2 * | 10/2015 | Kim ................... H01L 31/1868 |
| 9,716,196 | B2 * | 7/2017 | Nie ................... H01L 31/03046 |
| 2002/0023674 | A1 | 2/2002 | Sugawara et al. |
| 2006/0180200 | A1 | 8/2006 | Platzer Bjorkman et al. |
| 2008/0092946 | A1 | 4/2008 | Munteanu et al. |
| 2009/0165855 | A1 | 7/2009 | Sun et al. |
| 2009/0205709 | A1 | 8/2009 | Kim |
| 2009/0314342 | A1 | 12/2009 | Bent et al. |
| 2011/0067755 | A1 | 3/2011 | Hakuma et al. |
| 2011/0094557 | A1 | 4/2011 | Mitzi et al. |
| 2011/0097496 | A1 | 4/2011 | Mitzi et al. |
| 2011/0114157 | A1 | 5/2011 | Meissner |
| 2011/0232760 | A1 | 9/2011 | Shirata |
| 2011/0259424 | A1 | 10/2011 | Basol |
| 2011/0272012 | A1 * | 11/2011 | Heng ................... H01L 31/0745 136/255 |
| 2012/0024366 | A1 | 2/2012 | Liu et al. |
| 2012/0042942 | A1 | 2/2012 | Park et al. |
| 2012/0100664 | A1 * | 4/2012 | Guha ................ H01L 21/02422 438/86 |
| 2012/0167980 | A1 | 6/2012 | Engelhart |
| 2012/0222735 | A1 | 9/2012 | Xu |
| 2013/0008500 | A1 * | 1/2013 | Lin ........................ C03B 27/04 136/256 |
| 2014/0102520 | A1 * | 4/2014 | Tauke-Pedretti .... H01L 31/0687 136/255 |

OTHER PUBLICATIONS

Dingemans, et al. "Status and Prospects of Al2O3-Based Surface Passivation Schemes for Silicon Solar Cells" Journal of Vacuum Science & Technology A: Vacuum, Surfaces, and Films, vol. 30, Issue: 4. Jul. 2012. pp. 1-27.

Hsu, W., et al. "Surface Passivation of Cu(In,Ga)Se2 Using Atomic Layer Deposition Al2O3" Applied Physics Letters, vol. 100. Nov. 2012. (4 Pages).

Katagiri, H., et al. "Development of CZTS-Based Thin Film Solar Cells" Thin Solid Films, vol. 517, No. 7. Feb. 2009. pp. 2455-2460.

Kessels, W., et al. "Atomic Layer Deposition: Prospects for Solar Cell Manufacturing" Photovoltaic Specialists Conference (PVSC '08). 33rd IEEE. May 2008. (5 Pages).

Todorov, T., et al. "High-Efficiency Solar Cell With Earth-Abundant Liquid-Processed Absorber" Advanced Energy Materials. Feb. 2010. pp. E156-E159.

Yan, Y. "Understanding of Defect Physics in Polycrystalline Photovoltaic Materials" 37th IEEE Photovoltaic Specialists Conference (PVSC 37). Jun. 2011. pp. 1218-1222.

Non-Final Office Action for U.S. Appl. No. 13/969,046 dated Mar. 21, 2016.

* cited by examiner

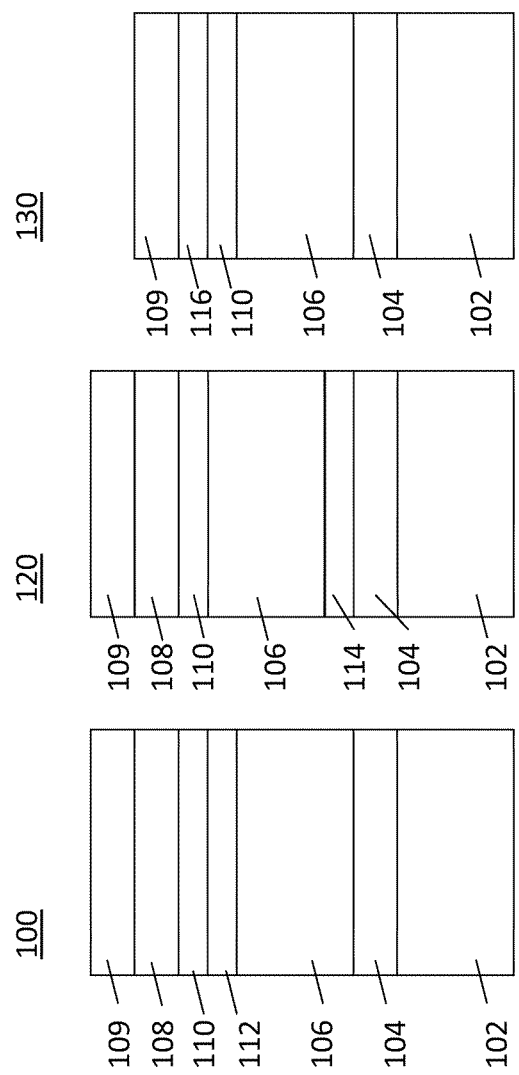

ATOMIC LAYER DEPOSITION FOR PHOTOVOLTAIC DEVICES

RELATED APPLICATION DATA

This application is a Continuation application of co-pending U.S. patent application Ser. No. 13/685,126 filed on Nov. 26, 2012, incorporated herein by reference in its entirety.

BACKGROUND

Technical Field

The present invention relates to photovoltaic devices, and more particularly to methods and devices where atomic layer deposition processes are employed to provide buffer layers and/or passivation layers for a Cu—Zn—Sn containing chalcogenide compound absorber layer.

Description of the Related Art

A solar cell may be described in terms of a fill factor (FF). FF is a ratio of the maximum power point ($P_m$) divided by open circuit voltage ($V_{oc}$) and short circuit current ($J_{sc}$):

$$FF = \frac{P_m}{V_{oc}J_{sc}}.$$

The fill factor is directly affected by the values of a cell's series and shunt resistance. Increasing the shunt resistance ($R_{sh}$) and decreasing the series resistance (Rs) will lead to a higher fill factor, thus resulting in greater efficiency, and pushing the cells output power closer towards its theoretical maximum. The increased efficiency of photovoltaic devices is of utmost importance in the current energy environment.

Emitter—absorber photovoltaic devices often include exotic materials that are both rare and often toxic. For example, thin-film materials of the type $Cu(In,Ga)(S,Se)_2$ (CIGS), while efficient, include rare indium metal, which is expected to be of high cost and short supply in future large-scale photovoltaic device production—an issue which is further exacerbated by the growing indium consumption for thin film display production. Other materials such as $Cu_2S$ and CdTe have also been proposed as absorbers but while $Cu_2S$ suffers from low stability in devices, rare tellurium and toxic cadmium limits CdTe usage.

SUMMARY

A photovoltaic device and method include a substrate, a conductive layer formed on the substrate and an absorber layer formed on the conductive layer from a Cu—Zn—Sn containing chalcogenide material. An emitter layer is formed on the absorber layer and a buffer layer is formed on the emitter layer including an atomic layer deposition (ALD) layer. A transparent conductor layer is formed on the buffer layer.

Another photovoltaic device includes a substrate, a conductive layer formed on the substrate and an absorber layer formed on the conductive layer from a Cu—Zn—Sn containing chalcogenide material. A passivation layer is formed in contact with the absorber layer and includes an atomic layer deposition (ALD) layer having a thickness of less than about 25 Angstroms. An emitter layer is formed over the absorber layer, and a transparent conductor layer is formed on the emitter layer.

A method for forming a photovoltaic device includes depositing a conductive layer on a substrate; forming an absorber layer formed from a Cu—Zn—Sn containing chalcogenide material on the conductive layer; forming an emitter layer on the absorber layer; depositing a buffer layer on the emitter layer by employing an atomic layer deposition (ALD) process to form the buffer layer; and depositing a transparent conductor layer formed on the buffer layer.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein:

FIG. 1 is a cross-sectional view of a photovoltaic device having a passivation layer formed by atomic layer deposition between an emitter and absorber layer in accordance with the present principles;

FIG. 2 is a cross-sectional view of a photovoltaic device having a passivation layer formed by atomic layer deposition in contact with an absorber layer but on an opposite surface relative to a position of an emitter in accordance with the present principles;

FIG. 3 is a cross-sectional view of a photovoltaic device having a buffer layer formed by atomic layer deposition between an emitter and a transparent conductive layer in accordance with the present principles.

DETAILED DESCRIPTION OF PREFERRED EMBODIMENTS

Figure 4:
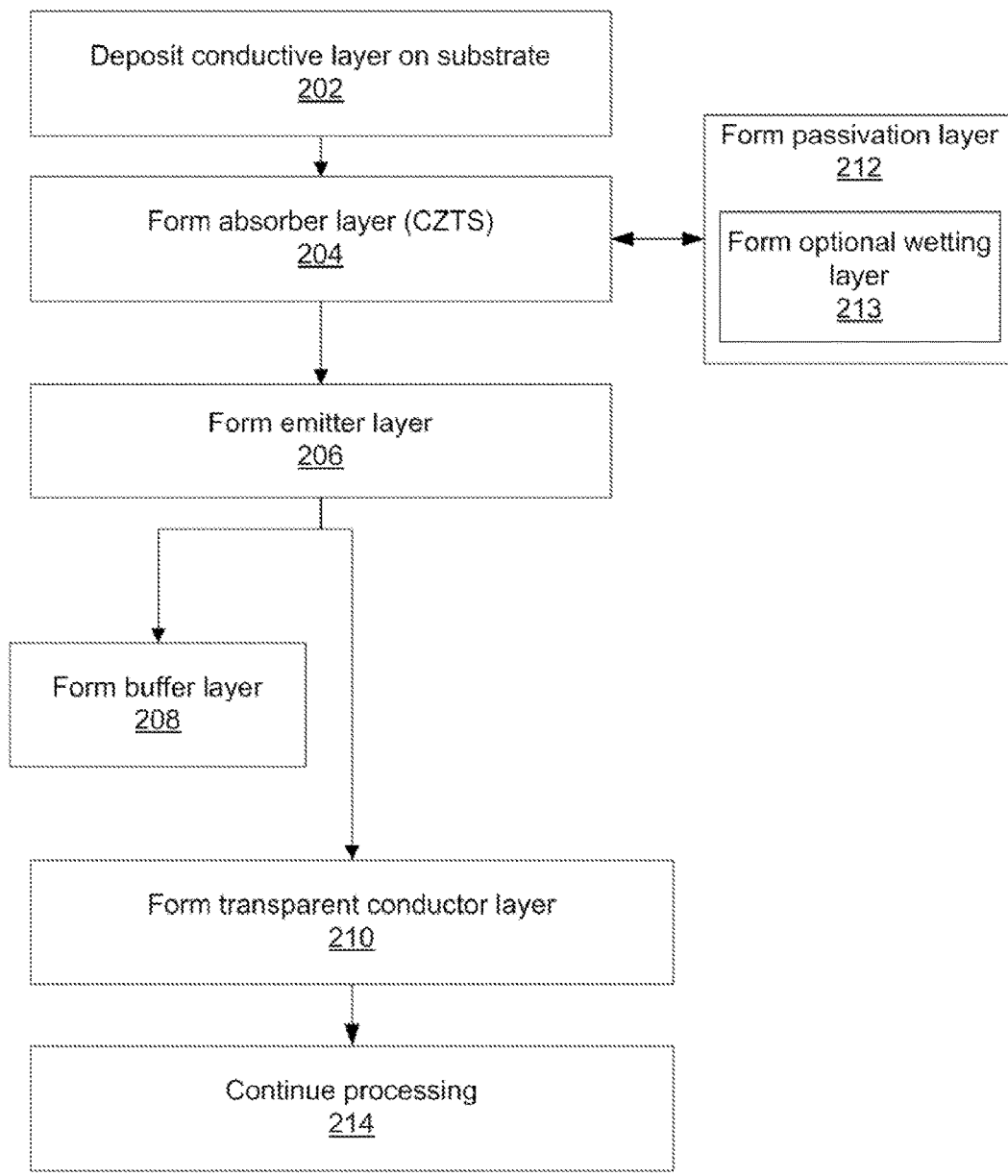
FIG. 4 is a block/flow diagram showing methods for forming a photovoltaic device in accordance with illustrative embodiments.

In accordance with the present principles, photovoltaic devices are provided having a buffer layer and/or a passivation layer on or in contact with an absorber material of the device. The buffer layer or passivation layer includes a thin layer of material formed using an atomic layer deposition (ALD) process. The ALD layer preferably includes a metal oxide. In one embodiment, $Al_2O_3$, may be employed although other materials may be included or substituted.

In one useful embodiment, a photovoltaic device includes an absorber layer and an emitter layer. An ALD passivation layer may be formed in between the absorber layer and the emitter layer, or the ALD passivation layer may be formed on the absorber layer opposite the emitter layer. In another embodiment, a buffer layer in contact with the emitter, which is normally a thick ZnO material may be replaced by an ultra-thin ALD layer. In a particularly useful embodiment, the absorber includes a Cu—Zn—Sn containing chalcogenide compound.

In accordance with the present principles, it has been discovered that by employing a Cu—Zn—Sn containing chalcogenide compound, such as an earth abundant CZTS ($Cu_{2-x}Zn_{1+y}Sn(S_{1-z}Se_z)_{4+q}$ wherein $0 \leq x \leq 1$; $0 \leq y \leq 1$; $0 \leq z \leq 1$; $-1 \leq q \leq 1$), as an absorber with a ALD oxide passivation layer provides a synergistic effect to significantly improve fill factor and device efficiency. Further, it has also been discovered that a CZTS absorber layer may be employed with an ALD oxide buffer layer instead of a ZnO buffer layer. The ALD oxide buffer layer is ultra-thin and does not damage the underlying emitter layer during fabrication as does the use of a thick ZnO buffer layer employed in conventional designs.

It is to be understood that the present invention will be described in terms of a given illustrative heterojunction architecture having illustrative substrates and photovoltaic stacks; however, other architectures, structures, substrates, materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for a photovoltaic device may be created for integrated circuit integration or may be combined with components on a printed circuit board. The circuit/board may be embodied in a graphical computer programming language, and stored in a computer storage medium (such as a disk, tape, physical hard drive, or virtual hard drive such as in a storage access network). If the designer does not fabricate chips or the photolithographic masks used to fabricate chips or photovoltaic devices, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of photovoltaic devices and/or integrated circuit chips with photovoltaic devices. The resulting devices/chips can be distributed by the fabricator in raw wafer form (that is, as a single wafer that has multiple unpackaged devices/chips), as a bare die, or in a packaged form. In the latter case the device/chip is mounted in a single chip package (such as a plastic carrier, with leads that are affixed to a motherboard or other higher level carrier) or in a multichip package (such as a ceramic carrier that has either or both surface interconnections or buried interconnections). In any case, the devices/chips are then integrated with other chips, discrete circuit elements, and/or other signal processing devices as part of either (a) an intermediate product, such as a motherboard, or (b) an end product. The end product can be any product that includes integrated circuit chips, ranging from toys, energy collectors, solar devices and other applications including computer products or devices having a display, a keyboard or other input device, and a central processor. The photovoltaic devices described herein are particularly useful for solar cells, panels or modules employed to provide power to electronic devices, homes, buildings, vehicles, etc.

It should also be understood that material compounds will be described in terms of listed elements, e.g., CdS. These compounds include different proportions of the elements within the compound, e.g., CdS includes $Cd_xS_{1-x}$ where x is less than or equal to 1, etc. In addition, other elements may be included in the compound, such as, e.g., dopants, etc. and still function in accordance with the present principles.

The present embodiments may be part of a photovoltaic device or circuit, and the circuits as described herein may be part of a design for an integrated circuit chip, a solar cell, a light sensitive device, etc. The photovoltaic device may be a large scale device on the order of feet or meters in length and/or width, or may be a small scale device for use in calculators, solar powered lights, etc.

It is also to be understood that the present invention may be employed with or as a tandem (multi-junction) structure; however, other architectures, structures, substrate materials and process features and steps may be varied within the scope of the present invention.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, an illustrative photovoltaic structure 100 is illustratively depicted in accordance with one embodiment. The photovoltaic structure 100 may be employed in solar cells, light sensors, photosensitive devices or other photovoltaic applications. The structure 100 includes a substrate 102. The substrate 102 may include glass or other inexpensive substrate, such as metal, plastic or other material suitable for photovoltaic devices (e.g., quartz, silicon, etc.). A conductive layer 104 is formed on the substrate 102. The conductive layer 104 may include molybdenum although other high work-function materials may be employed (e.g., Pt, Au, etc.). The layer 104 provides a metal contact.

An emitter layer 110 may include CdS or other materials that serve as an N-type layer. An absorber layer 106 includes a Cu—Zn—Sn containing chalcogenide compound with a kesterite structure of the formula: $Cu_{2-x}Zn_{1+y}Sn(S_{1-z}Se_z)_{4+q}$ wherein $0 \leq x \leq 1$; $0 \leq y \leq 1$; $0 \leq z \leq 1$; $-1 \leq q \leq 1$. The Cu—Zn—Sn-containing chalcogenide, such as a $Cu_2ZnSn(S,Se)_4$ (CZTS) based layer serves as a P-type material. In one embodiment, the CZTS film has a thickness of between about 0.2 to 4.0 microns and more preferably about 2 microns. Layer 106 may be formed by painting, sputtering, co-evaporation, electroplating, spin coating, slit casting, doctor blading, dip coating or other simple coating processes. In one illustrative embodiment, absorber layer 106 includes CZTS (or CZTS with some Se substituted for S) which provides a band gap ($E_g$) from about 1 to 1.5 eV. Although the major elements in CZTS are Cu, Zn, Sn, S, Se, reference to CZTS or Cu—Zn—Sn containing chalcogenide material also includes compositions that optionally contain Ge replacing some or all of the Sn and that may also contain other dopants, including Sb, Bi, Na, K, Li, Ca, etc.

In a particularly useful embodiment, $Cu_2ZnSn(S, Se)_4$ (CZTS or CZTSe) is employed for the absorber layer 106. CZTS has many benefits. It is low cost and environmentally harmless being fabricated using naturally abundant materials. CZTS provides good optical properties and has a band-gap energy from approximately 1 to 1.5 eV, depending on the degree of substitution of S with Se, and a large absorption coefficient in the order of $10^4$ $cm^{-1}$. Eliminating the reliance on rare indium metal (also heavily consumed by one of the fastest growing industries—thin film displays) opens the possibility of almost limitless material supply for production capacities well above 100 GWp/year. The efficiency of CZTS can be maximized by making a tandem cell with an amorphous silicon cell having higher band gap and thus allowing more effective light harvesting across the solar spectrum.

Layer 110 is preferably thin, e.g., 1 nm to about 100 nm, more preferably around 5 nm to around 70 nm. The layer 110 provides an N-type layer (e.g., n-CdS). Layer 104 (e.g., Mo layer) can be thicker than layer 110 to enable sufficient conductivity for adequate series resistance. Preferably, layer 104 has a thickness from around 100 nm to around 2000 nm. More preferably, layer 104 has a thickness of from around 250 nm to around 1000 nm. Other N-type layers can also be employed for emitter layer 110, including, e.g., ZnS, CdTe, Zn(O,S) (zinc oxysulfide), $In_2S_3$ and ZnO.

In accordance with one embodiment, an atomic layer deposition (ALD) process is employed to provide a passivation layer 112 between the emitter layer 110 and the absorber layer 106. The passivation layer is preferably ultra-thin, e.g., between a monolayer to about 25 Angstroms thick. It should be understood that thicker layers may be employed with different materials or structures, e.g., other materials or doping conditions may be optimal at higher thickness. ALD includes exposing a surface to stages of flowing gases to reduce undesirable interactions and promote pristine and high quality material layers. The passivation layer 112 may include a metal oxide, such as e.g., $Al_2O_3$, although other oxides may be employed, such as $HfO_2$, ZnO, etc. The passivation layer 112 passivates semiconductor surfaces of the structure 100 and may also be employed as a shunt filtering layer.

The emitter layer 110 may have a buffer layer 108 formed thereon. The buffer layer 108 may include a conventional ZnO buffer layer having a thickness of between about 40 and 120 nm, or more preferably about 80 nm. Although a buffer layer 116 may be employed in accordance with the present principles (see e.g., FIG. 3). A transparent conductive layer 109 is formed over the buffer layer 108 (or layer 110 if the buffer layer 108 is not included). The transparent conductive layer 109 may include a transparent conductive oxide (TCO), such as, e.g., indium tin oxide (ITO), aluminum doped zinc oxide (AZO), boron doped zinc oxide (BZO) or other TCO materials. The transparent conductive layer 109 may include a thickness of between about 100 and 300 nm.

TABLE 1 shows results of different thickness passivation layers of $Al_2O_3$ between a CdS emitter and a CZTS absorber. Note that device efficiency achieved was nearly 8% when the passivation layer 112 was about 10 Angstroms in thickness as compared to no passivation layer (0 Angstroms in thickness) of only 5.28%.

TABLE 1

| Sample | Efficiency (%) | FF (%) | Voc (mV) | Jsc (mA/cm$^2$) |
|---|---|---|---|---|
| 25 Angstroms $Al_2O_3$ | 0.21 | 23.6 | 426.2 | 2.04 |
| 10 Angstroms $Al_2O_3$ | 7.97 | 63.4 | 410.8 | 30.6 |
| 5 Angstroms $Al_2O_3$ | 7.4 | 59.7 | 469.3 | 26.4 |
| 0 Angstroms $Al_2O_3$ | 5.28 | 52.9 | 407.7 | 24.5 |

Referring to FIG. 2, an alternate structure 120 provides a passivation layer 114 on an opposite surface of the absorber layer 106 relative to the emitter layer 110. The passivation layer 114 functions in a similar way as the passivation layer 112, but passivates a different surface of the absorber layer 106. The passivation layer 112 may be employed in different photovoltaic cell configurations where advantages may be gained by passivating the absorber layer 106 at or near the conductive layer 104.

In accordance with one embodiment, an atomic layer deposition (ALD) process is employed to form the passivation layer 114 between the conductive layer 104 and the absorber layer 106. Note that an optional wetting layer (not shown) may be needed between the passivation layer 114 and the absorber layer 106. The use of the wetting layer will depend on material selection.

The passivation layer 114 is preferably ultra-thin, e.g., between a monolayer to about 25 Angstroms thick. ALD includes exposing a surface to stages of flowing gases to reduce undesirable interactions and promote pristine and high quality material layers. The passivation layer 114 may include a metal oxide, such as e.g., $Al_2O_3$, although other oxides may be employed, such as $HfO_2$, ZnO, etc. The passivation layer 114 passivates semiconductor surfaces of the structure 120 and may also be employed as a shunt filtering layer. It should be noted that the buffer layer 116 (and/or passivation layers 112 and 114) include an ultra-thin thickness to influence the atomic coordination of atoms at the surface, which control device parameters such as surface recombination, effective lifetime, band-bending, or shunt paths, without the insulation properties that would normally be provided in a bulk or thicker film of these materials.

The buffer layer 108 may also be formed. The buffer layer 108 may include a conventional ZnO buffer layer having a thickness of between about 40 and 120 nm. Although a buffer layer 116 may also be employed in accordance with the present principles (see e.g., FIG. 3).

Referring to FIG. 3, in another embodiment, a structure 130 provides a buffer layer 116 formed between the emitter layer 110 and the transparent conductive layer 109. As described above, buffer layers are almost exclusively formed from ZnO in conventional devices of this type. The ZnO buffer layer is usually formed by a sputtering process and is formed relatively thick (e.g., between about 40-120 nm). The sputtering process often damages the underlying emitter layer 110 or the junction between the emitter layer 110 and absorber 106. This damage can result in poor performance of the device, and the sputtering may result in a less than optimal morphology of the ZnO layer. While more expensive processes may be employed to form a higher grade ZnO layer, this adds expense to the device.

In accordance with the present principles, the conventional ZnO buffer layer is replaced by an ALD metal oxide buffer layer 116. The buffer layer 116 provides a high quality oxide without causing damage to the emitter layer 110. In addition, the ALD buffer layer 116 is ultra-thin, keeping process times down as well as expense while providing a high quality oxide buffer.

In accordance with one embodiment, an atomic layer deposition (ALD) process is employed to form the buffer layer 116 between the transparent conductive layer 109 and the emitter layer 110. The buffer layer 116 is preferably ultra-thin, e.g., between a monolayer to about 25 Angstroms thick. ALD provides pristine and high quality material layers. The buffer layer 116 may include a metal oxide, such as e.g., $Al_2O_3$, although other oxides may be employed, such as $HfO_2$, etc. The buffer layer 116 provides a work function between the work functions of the materials of adjacent layers (e.g., 109 and 110).

The buffer layer 116 may include a thickness of only 1 nm and (as compared with a conventional ZnO buffer layer having a thickness of between about 40 and 120 nm). This significantly lower thickness improves the amount of radiation that passes through to the emitter 110. It should be noted that the buffer layer 116 may be employed with one or more passivation layers (112, 114) formed in accordance with the present principles (as described with reference to FIGS. 1 and 2).

TABLE 2 shows results of different thickness buffer layers of $Al_2O_3$ on a CdS emitter with a CZTS absorber (see FIG. 1). Note that device efficiency achieved was nearly 7.78% when the buffer layer 112 was about 10 Angstroms in thickness as compared to a ZnO buffer layer with efficiency of 7.24%. With the improved efficiency, long term effects of damage caused to the emitter are avoided as well as the other advantages including those previously described.

TABLE 2

| Sample | Efficiency (%) | FF (%) | Voc (mV) | Jsc (mA/cm$^2$) |
| --- | --- | --- | --- | --- |
| 20 Angstroms of $Al_2O_3$ | 0.96 | 24.6 | 224 | 17.4 |
| 15 Angstroms of $Al_2O_3$ | 8.37 | 61.2 | 420.5 | 32.52 |
| 10 Angstroms of $Al_2O_3$ | 7.78 | 62.3 | 462.9 | 26.9 |
| 0 Angstroms $Al_2O_3$ with ZnO buffer | 7.24 | 61 | 384 | 30.9 |

Additional experimental data show efficiencies for an ALD $Al_2O_3$ buffer layer formed on the CdS emitter to be about 8.5% (FF exceeding 67) at thicknesses between about 5 Angstroms and 20 Angstroms. Further, efficiencies for an ALD $Al_2O_3$ passivation layer formed between the CdS emitter and the CZTS absorber were about 8% (FF greater than 66) at thicknesses between about 5 Angstroms and 20 Angstroms. According to the experimental data, the highest efficiencies are achieved between about 8 Angstroms and about 15 Angstroms for both the passivation and the buffer layer. It should be understood that in some embodiments, both the buffer layer (116) and the passivation layer (112 and/or 114) may be employed together in a same photovoltaic device. The buffer layer (116) and passivation layer(s) (112 and/or 114) are formed from an ALD metal oxide, e.g., $Al_2O_3$.

Referring to FIG. 4, methods for forming photovoltaic devices are illustratively shown. The flowchart and block diagrams in FIG. 4 illustrate the architecture, functionality, and operation of possible implementations of systems and methods according to various embodiments of the present invention. It should also be noted that, in some alternative implementations, the functions noted in the blocks may occur out of the order noted in FIG. 4. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In block 202, a conductive layer is deposited on a substrate. The substrate may include glass, metal, polymers, etc. The conductive layer (back contact) may include a high-work function material such as Mo, Pt, Au, etc. In block 204, an absorber layer is formed. In a particularly useful embodiment, a Cu—Zn—Sn containing chalcogenide material is formed on the conductive layer. The absorber layer may include a Cu—Zn—Sn containing chalcogenide compound with a kesterite structure of the formula: $Cu_{2-x}Zn_{1+y}Sn(S_{1-z}Se_z)_{4+q}$ wherein $0 \leq x \leq 1$; $0 \leq y \leq 1$; $0 \leq z \leq 1$; $-1 \leq q \leq 1$. Particularly favorable electronic properties of these materials are found in a relatively narrow compositional range, e.g., Cu/(Zn+Sn)=0.7-0.9 and Zn/Sn=1-1.3.

The absorber layer can be prepared by any standard vacuum or non-vacuum deposition technique. In useful embodiments, the absorber layer can be prepared by evaporation, sputtering, electroplating, casting, spraying (painting), printing, etc. The absorber layer may be formed by an ink-based coating or printing process. A liquid, ink-based technique is suitable for large-scale low-cost manufacturing. The coating process is preferably performed in the order of minutes and more preferably in less than one minute.

An ink-based approach exists which enables the deposition of Cu—Zn—Sn containing chalcogenide compound absorber layer films. This liquid-based approach employs Zn-based nanoparticles and a hydrazine-based solution that contains Cu, Sn, and at least one of S and Se. An aqueous-based non-hydrazine approach may be employed to prepare CZTS thin films.

One example preparation of a $Cu_2ZnSn(S,Se)_4$ film may be by ink (slurry) spin coating and may include the following. All operations may be performed in a nitrogen-filled glove box. The deposition solution can be prepared in two parts in glass vials under magnetic stirring: In one example, part A1 was formed by dissolving $Cu_2S$, 0.573 g and sulfur, 0.232 g in 3 ml of hydrazine and part B1 was formed by mixing SnSe, 0.790 g, Se, 1.736 g and Zn, 0.32 g with 7 ml of hydrazine. After 3 days under magnetic stirring, solution A1 had an orange transparent aspect, while B1 was dark green and opaque. Solution A1 and slurry B1 were mixed (C1) before deposition. A more efficient method may include employing all elemental precursor compounds (Cu, S, Sn Se, Zn) rather than binary compounds, e.g., $Cu_2S$ or SnSe).

Films were deposited on soda lime glass substrates coated with 700 nm molybdenum by spin coating of slurry C1 at 800 rpm and heating to 540° C. for 2 minutes. The coating and heating cycle were repeated 5 times before a final anneal was carried out for 10 minutes. For $Cu_{2-x}Zn_{1+y}Sn(S_{1-z}Se_z)_{4+q}$ where $0 \leq x \leq 1$; $0 \leq y \leq 1$; $0 \leq z \leq 1$; $-1 \leq q \leq 1$, z is controlled during formation to adjust a band gap.

In another example, zinc formate, 1.112 g was dispersed in 1.5 ml hydrazine (Slurry I). Tin powder, 0.789 g and Se, e.g., 3 g were dissolved in 5 ml hydrazine (Solution J). Copper powder, 0.683 g and sulfur, 0.505 g were dissolved in 4 ml hydrazine (Solution K). Solution J was added to Solution K followed by 1 ml of hydrazine used to wash vial J resulting in solution L. Solution L was added to slurry I followed by 1 ml of hydrazine used to wash vial L, forming deposition ink M. Two (2) ml of ink M was added to 0.5 ml HZ forming deposition ink N.

On a molybdenum-coated glass, one layer of ink M was spun at 1200 rpm followed by six layers spun at 600 rpm and one layer of ink N spun at 500 rpm and annealed on a hot plate at a maximum temperature above 540 degrees C.

The optical band gap for the CZTS layers, however formed, may be tuned from approximately 1 to 1.5 eV by controlled substitution of the sulfur with selenium. It should be understood that these examples are not limiting and that other methods may be employed for forming the absorber layer.

In block 206, an emitter layer is formed. The emitter may include CdS, CdTe, ZnS, Zn(O,S), $In_2S_3$, ZnO, or any other emitter materials. The emitter may be deposited using a chemical bath or chemical surface deposition process. Other deposition techniques may include ALD, chemical vapor deposition, sputtering, etc.

In block 208, in one embodiment, a buffer layer may be formed on the emitter layer by employing an atomic layer deposition (ALD) process to form the buffer layer having a thickness of less than about 25 Angstroms. In a particularly useful embodiment, the buffer layer includes $Al_2O_3$, and the thickness of the buffer layer is between about 8 and about 15 Angstroms.

The ALD process is a thin film deposition technique that is based on sequential use of a gas phase chemical process. ALD reactions use two or more precursors that react with a surface one at a time in a sequential, self-limiting, manner. For example, the precursors include elements or compounds to form a metal oxide (e.g., $Al_2O_3$, etc.). By exposing the precursors to the growth surface repeatedly, a thin film is deposited. The amount of film material deposited in each reaction cycle is nominally constant. Sequential surface chemistry deposits conformal thin-films of materials of varying compositions.

ALD film growth permits atomic scale deposition control. ALD reactions break chemical vapor deposition (CVD) reactions into two half-reactions, keeping the precursor materials separate during the reaction. Film growth can be controlled as fine as ~0.1 Å per cycle. Separation of the precursors is accomplished by pulsing a purge gas (e.g., nitrogen or argon) after each precursor pulse to remove excess precursor from the process chamber. The growth of layers by ALD includes exposing a first precursor, e.g., an organometallic compound, purging or evacuating the reaction chamber to remove the non-reacted precursors and the gaseous reaction by-products, exposing of a second precursor or another treatment to activate the surface again for the reaction of the first precursor, such as a plasma, and purging or evacuating of the reaction chamber. Each reaction cycle adds a given amount of material to the surface, referred to as the growth per cycle. To grow a material layer, reaction cycles are repeated. One cycle may take from 0.5 s to a few seconds and deposit between 0.1 and 3 Å of film thickness. ALD is a surface-controlled process, where process parameters other than the precursors, surface material, and temperature have little or no influence.

In block 210, a transparent conductor layer is deposited on the buffer layer, e.g., a transparent conductive oxide (TCO). The TCO may be deposited using CVD, or other suitable processes. The TCO may include ITO, AZO, BZO or similar materials.

In block 212, a passivation layer may be formed in contact with absorber layer. This may include being formed above or below the absorber layer. The passivation layer may be employed with the buffer layer or may be employed without the buffer layer. The passivation layer preferably includes an atomic layer deposition (ALD) layer having a thickness of less than about 25 Angstroms. In one particularly useful embodiment, the passivation layer includes $Al_2O_3$ and the thickness of the passivation layer is between about 8 and about 15 Angstroms.

In some instances, in block 213, a wetting layer may be formed on top of a passivation layer (e.g., layer 114) to enhance the ability to form additional layers thereon. For example, materials such as hydrazine needed to form the absorber layer do not readily wet to $Al_2O_3$. The intermediate wetting layer may include a thin metal layer, e.g., a Mo layer. The wetting layer may be a few Angstroms thick, although thicker layers may be employed. When passivation layer 114 (FIG. 2) is employed, the wetting layer is deposited before forming a CZTS absorber layer. Wetting layers may be employed to assist in forming other layers as well, if needed.

Embodiments in accordance with the present principles may include a buffer layer and one or more passivation layers, a buffer layer only, and one or more passivation layers only. In block 214, processing is continued to complete the device.

Having described preferred embodiments for atomic layer deposition for photovoltaic devices (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A photovoltaic device, comprising:
an absorber layer formed on a conductive layer from a Cu—Zn—Sn containing chalcogenide material;
an aluminum oxide including passivation layer formed by atomic layer deposition in direct contact with the absorber layer having a thickness of 15 Angstroms or less; and
a cadmium including emitter layer formed in direct contact with the aluminum oxide including passivation layer.

2. The device as recited in claim 1, wherein the Cu—Zn—Sn containing chalcogenide material is a compound with a kesterite structure of the formula: $Cu_{2-x}Zn_{1+y}Sn(S_{1-z}Se_z)_{4+q}$ wherein $0 \le x \le 1$; $0 \le y \le 1$; $0 \le z \le 1$; $-1 \le q \le 1$.

3. The device as recited in claim 1, wherein the cadmium including emitter layer includes one of CdS and CdTe.

4. The device as recited in claim 1, wherein the conductive layer includes molybdenum.

5. The device as recited in claim 1, wherein the conductive layer is present on a glass substrate.

6. The device as recited in claim 1 further comprising a transparent conductor layer on the cadmium including emitter layer.

7. The device as recited in claim 6, further comprising a buffer layer formed between the emitter layer and the transparent conductor layer.

8. The device as recited in claim 7, the buffer layer including an atomic layer deposition (ALD) layer having a thickness of less than about 25 Angstroms.

9. The device as recited in claim 8, wherein the buffer layer includes $Al_2O_3$ and the thickness of the passivation layer is between about 8 and about 15 Angstroms.

* * * * *